United States Patent
Lin et al.

(10) Patent No.: US 9,954,163 B2
(45) Date of Patent: Apr. 24, 2018

(54) STRUCTURES AND METHODS FOR SHIELDING MAGNETICALLY SENSITIVE COMPONENTS

(71) Applicant: Everspin Technologies, Inc., Chandler, AZ (US)

(72) Inventors: Wenchin Lin, Chandler, AZ (US); Jason Janesky, Gilbert, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days.

(21) Appl. No.: 14/712,130

(22) Filed: May 14, 2015

(65) Prior Publication Data
US 2015/0333251 A1 Nov. 19, 2015

Related U.S. Application Data

(60) Provisional application No. 61/993,668, filed on May 15, 2014.

(51) Int. Cl.
*H01L 29/82* (2006.01)
*H01L 43/02* (2006.01)
(Continued)

(52) U.S. Cl.
CPC .............. *H01L 43/02* (2013.01); *G11C 5/005* (2013.01); *H01L 23/14* (2013.01); *H01L 23/552* (2013.01); *H01L 27/222* (2013.01); *H01L 43/12* (2013.01); *G11C 11/16* (2013.01); *H01L 23/13* (2013.01); *H01L 23/49816* (2013.01); *H01L 23/49838* (2013.01); *H01L 24/06* (2013.01); *H01L 24/29* (2013.01); *H01L 24/32* (2013.01); *H01L 24/33* (2013.01); *H01L 24/48* (2013.01); *H01L 24/49* (2013.01); *H01L 24/73* (2013.01); *H01L 24/83* (2013.01); *H01L 24/85* (2013.01);
(Continued)

(58) Field of Classification Search
CPC ........ H01L 43/02; H01L 23/14; H01L 27/222
USPC ........... 257/422, E43.005, E29.323, E43.001
See application file for complete search history.

(56) References Cited

U.S. PATENT DOCUMENTS 6,219,212 B1   4/2001   Gill et al.
6,906,396 B2   6/2005   Tuttle et al.
(Continued)

OTHER PUBLICATIONS

International Search Report and Written Opinion issued in corresponding International Application No. PCT/US2015/30959, dated Aug. 12, 2015 (9 pages).
(Continued)

*Primary Examiner* — Robert Huber
(74) *Attorney, Agent, or Firm* — Bookoff McAndrews, PLLC

(57) ABSTRACT

Structures and methods are disclosed for shielding magnetically sensitive components. One structure includes a substrate, a bottom shield deposited on the substrate, a magnetoresistive semiconductor device having a first surface and a second surface opposing the first surface, the first surface of the magnetoresistive semiconductor device deposited on the bottom shield, a top shield deposited on the second surface of the magnetoresistive semiconductor device, the top shield having a window for accessing the magnetoresistive semiconductor device, and a plurality of interconnects that connect the magnetoresistive semiconductor device to a plurality of conductive elements.

20 Claims, 13 Drawing Sheets

(51) Int. Cl.
  H01L 27/22 (2006.01)
  H01L 43/12 (2006.01)
  H01L 23/14 (2006.01)
  G11C 5/00 (2006.01)
  H01L 23/552 (2006.01)
  *G11C 11/16* (2006.01)
  *H01L 23/00* (2006.01)
  *H01L 23/13* (2006.01)
  *H01L 23/498* (2006.01)

(52) U.S. Cl.
  CPC .... *H01L 24/92* (2013.01); *H01L 2224/04042* (2013.01); *H01L 2224/06136* (2013.01); *H01L 2224/2919* (2013.01); *H01L 2224/32225* (2013.01); *H01L 2224/32245* (2013.01); *H01L 2224/33181* (2013.01); *H01L 2224/4824* (2013.01); *H01L 2224/49175* (2013.01); *H01L 2224/73215* (2013.01); *H01L 2224/83191* (2013.01); *H01L 2224/83192* (2013.01); *H01L 2224/85203* (2013.01); *H01L 2224/85205* (2013.01); *H01L 2224/92147* (2013.01); *H01L 2924/00014* (2013.01); *H01L 2924/1441* (2013.01); *H01L 2924/15311* (2013.01)

(56) References Cited

U.S. PATENT DOCUMENTS

| | | | |
|---|---|---|---|
| 7,598,597 | B2 | 10/2009 | Guo et al. |
| 7,772,679 | B2 | 8/2010 | Chang et al. |
| 8,415,775 | B2 | 4/2013 | Katti |
| 2008/0266938 | A1 | 10/2008 | Molla et al. |
| 2011/0147919 | A1 | 6/2011 | Sutardja |
| 2012/0119338 | A1* | 5/2012 | Watanabe ............ H01L 23/13 257/659 |
| 2014/0197505 | A1* | 7/2014 | Zhou .................. H01L 23/552 257/422 |

OTHER PUBLICATIONS

Extended European Search Report issued in corresponding European Application No. EP 15791935.8, which includes the supplementary European search report and the European search opinion, dated Jan. 2, 2018 (7 pages).

* cited by examiner

STRUCTURES AND METHODS FOR SHIELDING MAGNETICALLY SENSITIVE COMPONENTS

CROSS REFERENCE TO RELATED APPLICATIONS

This application claims the benefit of priority to U.S. Provisional Application No. 61/993,668, filed May 15, 2014, the entire contents of which is herein incorporated by reference.

TECHNICAL FIELD

The present disclosure relates to shielding semiconductor devices. More specifically, the present disclosure relates to shielding for semiconductor devices including one or more having magnetically sensitive materials.

INTRODUCTION

Magnetic materials are used, for example, in magnetic memory cells and magnetic sensors. Magnetoresistive Random Access Memory ("MRAM") is a non-volatile computer memory technology that uses magnetic charges to store data. MRAM includes, among other things, an array of magnetoresistive memory elements or cells. In one example, each memory cell has a structure that includes multiple magnetic layers separated by various non-magnetic layers. In general, storing data is accomplished by applying magnetic fields or spin torque to the magnetoresistive memory cells, and thereby causing the magnetic material in the memory cells to be magnetized into either of two possible memory states. Recalling data is accomplished by sensing resistance levels in the memory cell.

There is a growing interest in the development and use of MRAM devices for data retention because an MRAM combines the speed of static random access memory ("SRAM") with the non-volatility of flash memory. In addition, MRAM has relatively low power consumption, good reliability characteristics, and suffers little degradation over time in comparison to flash memory. Unfortunately, a problem with MRAM devices is that interference from an external magnetic field may cause errors.

Due to magnetic nature, it is desirable to provide a magnetoresistive memory device and packaging methodology that results in a higher immunity to external magnetic field disturbance.

BRIEF DESCRIPTION OF THE DRAWINGS

In the course of the detailed description to follow, reference will be made to the attached drawings. The drawings show different aspects of the present disclosure and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

In a first aspect of the present disclosure, a magnetic shield structure may be implemented for a magnetoresistive semiconductor device to protect the magnetoresistive semiconductor device from one or more external magnetic fields that may be applied to the magnetoresistive semiconductor device. The magnetic shield structure may be deposited to encourage the external magnetic fields to propagate through the shield instead of through the magnetoresistive semiconductor device.

Figure 1:
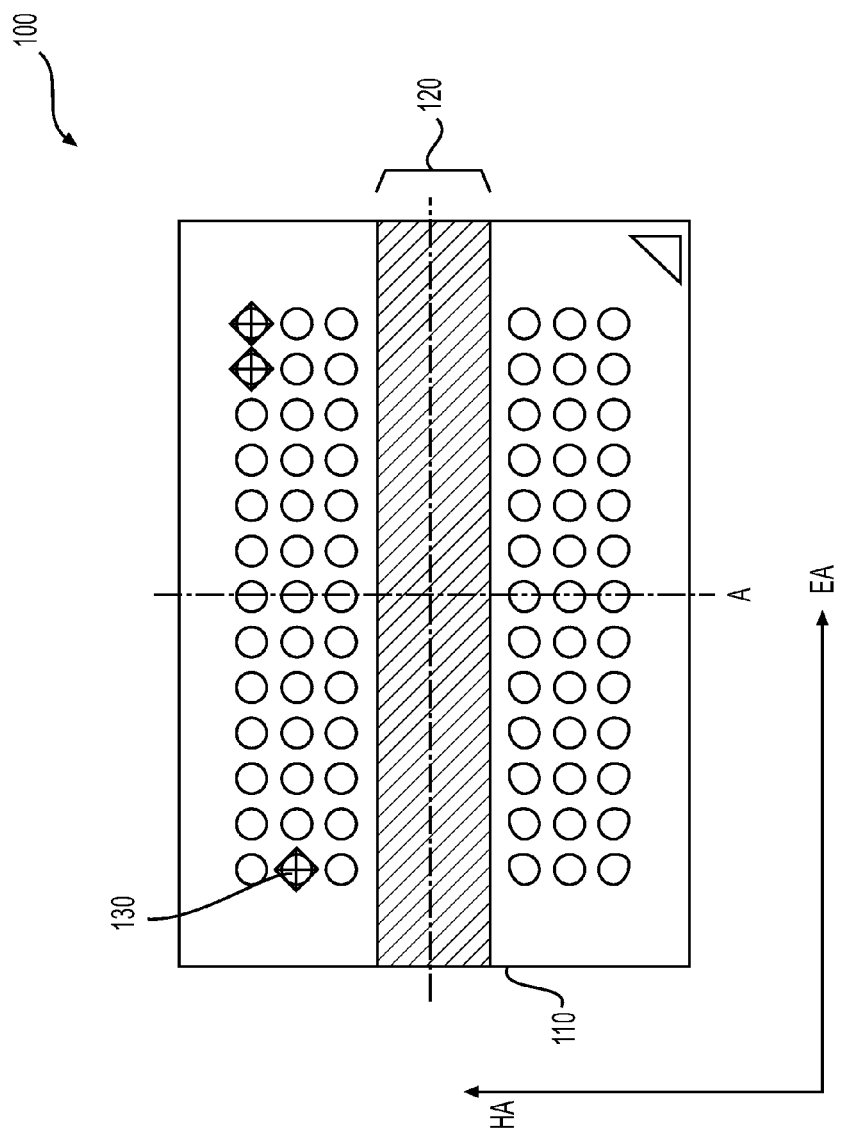
FIG. 1 depicts a top-down view of a magnetoresistive semiconductor device package, according to embodiments of the present disclosure.

In an exemplary embodiment, FIG. 1 depicts a top-down view of a window ball grid array ("WBGA") package 100.

A WBGA package 100 may include a magnetoresistive semiconductor device 110, such as a magnetoresistive memory device. For example, the magnetoresistive memory device may include a MRAM chip having an array of magnetic tunnel junction ("MTJ") bits. In order to access the magnetoresistive semiconductor device 110, a window 120 may be used for a plurality of interconnects (not shown) between the magnetoresistive semiconductor device 110 and a plurality of conductive elements 130. In some embodiments, the plurality of conductive elements 130 may include solder balls.

Figure 2:
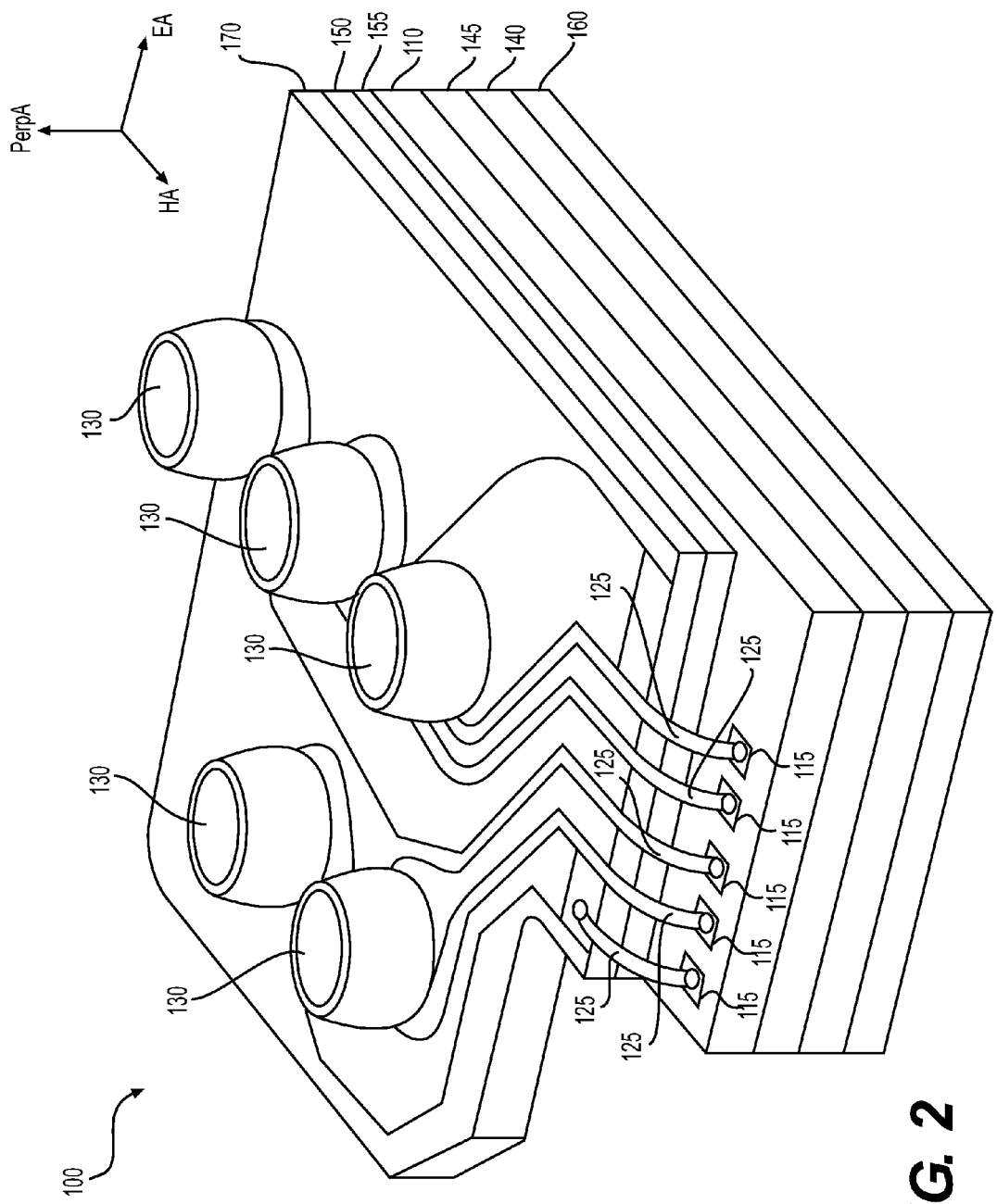
FIG. 2 depicts a cut-away perspective view of a magnetoresistive semiconductor device package, according to embodiments of the present disclosure.

As shown in FIG. 2, the magnetoresistive semiconductor device 110 may include a plurality of contacts 115 that may be used for controlling, accessing, reading, writing, and/or operating the magnetoresistive semiconductor device 110. The plurality of interconnects 125 may connect the magnetoresistive semiconductor device 110 through the window 120 to the plurality of conductive elements 130, such as a ball grid array ("BGA"). The plurality of interconnects 125 may be thin wires attached to the plurality of contacts 115 and the plurality of conductive elements 130 using, e.g., a wire bonding technique that employs some combination of heat, pressure, and/or ultrasonic energy to make a weld.

The plurality of conductive elements 130 may be adhered to a surface of substrate 170 for attachment with pads (not shown) arranged in a pattern on a printed circuit board (not shown) that corresponds to the arrangement of the plurality of conductive elements 130. The package 100 may be heated causing the plurality of conductive elements 130 to melt. Surface tension causes the molten the plurality of conductive elements 130 to hold the package 100 in alignment with a printed circuit board, at the correct separation distance, while the plurality of conductive elements 130 cool and solidify. Although a BGA surface mount technique is contemplated herein, other mounting techniques may alternatively be utilized.

In order to protect magnetoresistive semiconductor device 110 from an external magnetic field, shielding may be incorporated into the package 100. As shown in FIG. 2, a bottom shield 140 may be deposited below a first surface 111 of the magnetoresistive semiconductor device 110, and a top shield 150 may be deposited above a second surface 112 of the magnetoresistive semiconductor device 110. Though the use of a top and bottom shield is described herein, those of ordinary skill in the art will understand that only a bottom shield or a top shield may be provided within the principles of the present disclosure.

Bottom shield 140 and top shield 150 may be formed of a metal having a relatively high permeability. One such high permeability metal is a nickel-iron alloy, such as the commercially available Mu-metal®. The high permeability metal may be effective at screening and/or filtering static or low-frequency magnetic fields. High permeability metal may be provided in a sheet or foil format which may be readily fabricated into bottom shield 140 and top shield 150, and then subsequently adhered to magnetoresistive semiconductor device 110 utilizing a suitable adhesive technique. Although nickel-iron alloy is discussed herein, it should be understood that other materials having relatively high permeability and that do not retain their magnetization upon the removal of a magnetic field may be used. Additionally, and/or alternatively, bottom shield 140 and top shield 150 may be a soft magnetic material in some embodiments. Bottom shield 140 and top shield 150 may be fabricated to a specific dimension utilizing a photolithography and a wet etch process. Alternatively, a stamping technique may be employed to fabricate bottom shield 140 and top shield 150 to a precise dimension.

In one embodiment, an adhesive 145 may be in between the bottom shield 140 and the magnetoresistive semiconductor device 110. Adhesive 145 may bond the bottom shield 140 to the magnetoresistive semiconductor device 110. Additionally, and/or alternatively, an adhesive 155 may be in between the top shield 150 and the magnetoresistive semiconductor device 110. Adhesive 155 may similarly bond the top shield 150 to the magnetoresistive semiconductor device 110. The adhesives 145 and 150 may be at least one of a non-conductive paste and a non-conducive adhesive film.

When an external magnetic field ("H") is present in a direction along an easy axis ("EA") and/or hard axis ("HA"), as shown in FIG. 2, the external magnetic field may propagate through the top shield 150 or the bottom shield 140 The top shield 150 and the bottom shield 140 may be configured to limit or otherwise inhibit the external magnetic field ("H") from propagating from the top shield 150 to the bottom shield 140, and therefore, the magnetoresistive semiconductor device 110 may experience less magnetic field in the direction of the perpendicular axis, which may result from a coupling between top shield 150 and bottom shield 140.

Figure 3:
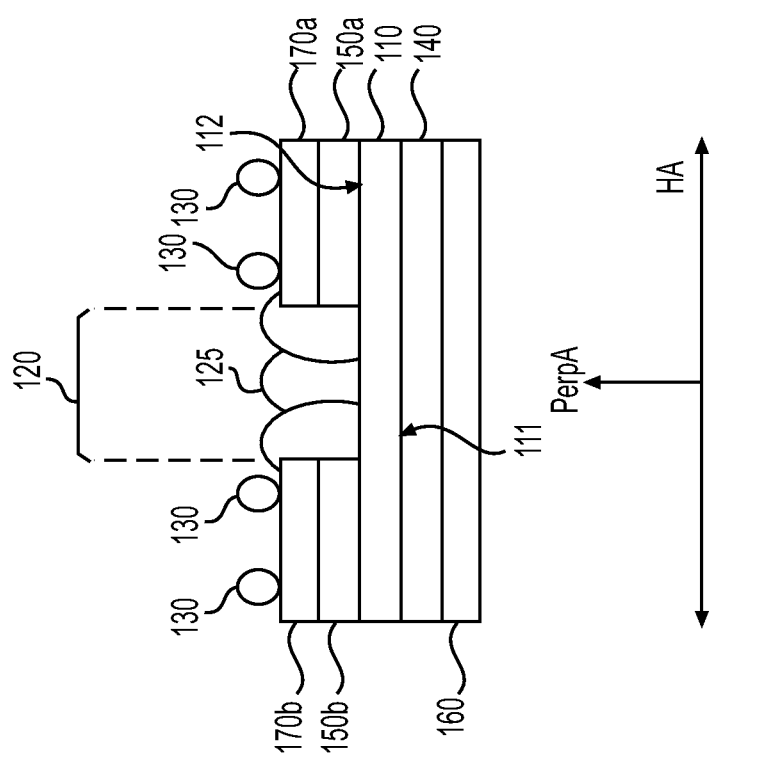
FIG. 3 depicts a cross-section view a magnetoresistive semiconductor device package, according to embodiments of the present disclosure.

FIG. 3 depicts a cross section view of an exemplary embodiment of the present disclosure. FIG. 3 may represent a cross section of the package 100, as shown by the dashed lined A of FIG. 1. The bottom shield 140 may be deposited on a planar surface of a substrate 160. The first surface 111 of the magnetoresistive semiconductor device 110 may be deposited on the bottom shield 140. The top shield 150a and top shield 150b may be deposited on the second surface 112 of the magnetoresistive semiconductor device 110. A window 120 may be between top shield 150a and top shield 150b. A substrate 170a and substrate 170b may be deposited on top shield 150a and top shield 150b, respectively. The plurality of conductive elements 130, such as solder balls, may be deposited on substrate 170a and substrate 170b. The plurality of interconnects 125 may connect the magnetoresistive semiconductor device 110 through the window 120 to the plurality of conductive elements 130.

In one embodiment of the present disclosure, thicknesses of bottom shield 140 and top shields 150a and 150b may range from 50 μm to 500 μm. In a particular embodiment, the thicknesses of bottom shield 140 and top shields 150a and 150b may be 150 μm. In some embodiments, top shields 150a and 150b may include similar or differing thicknesses. Similarly, the thickness of bottom shield 140 may be similar to or different from the thicknesses of one or both of top shields 150a and 150b. As used herein, the term "about" may include thicknesses that are +/−15% of the indicated thicknesses.

The magnetoresistive semiconductor device 110 may include an underlying magnetically sensitive circuit. The magnetoresistive semiconductor device 110 may be sensitive to internally induced magnetic fields. In addition, the magnetoresistive semiconductor device 110 may be sensitive to external magnetic fields.

The magnetoresistive semiconductor device 110 may be a magnetoresistive memory device having an array of magnetic memory cells, such as a MRAM chip having an array of magnetic tunnel junction ("MTJ") bits (not shown). The bits may be formed in the magnetoresistive semiconductor device 110 about 50 μm below the second surface 112 and under the top shields 150a and 150b, and about 150 μm above the first surface 111 and above bottom shield 140.

With such a configuration, a resulting magnetic field immunity may be at least about 100 Oe+/−15% in a direction along the easy, hard, and perpendicular axes.

Figure 4A:
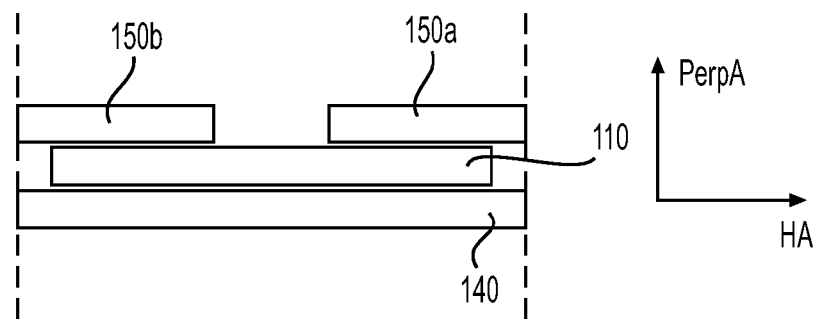
FIGS. 4A, 4B, and 4C depict cross-sectional views of various shielding arrangements, according to embodiments of the present disclosure.
Figure 4B:
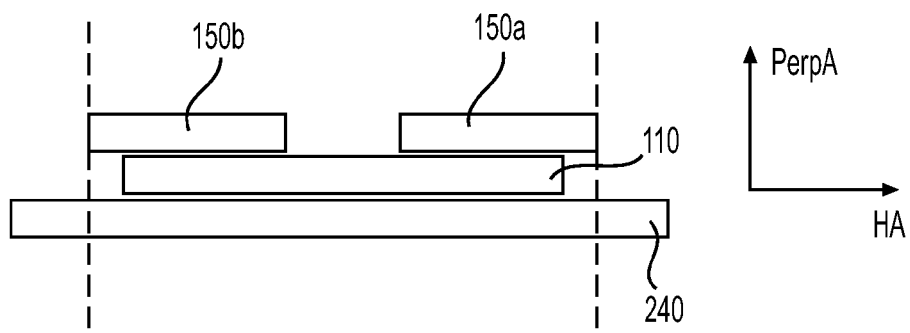
Figure 4C:
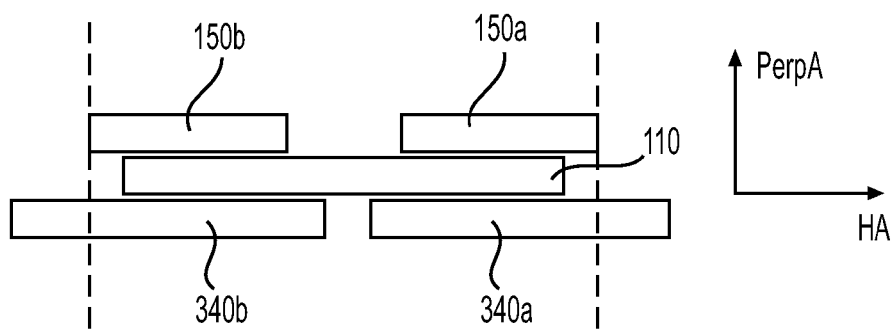

FIGS. 4A, 4B, and 4C depict cross-sectional views of various shielding arrangements, according to embodiments of the present disclosure. FIG. 4A depicts a top shield and bottom shield arrangement, as shown in FIG. 3. The bottom shield 140 and the top shields 150a and 150b may extend beyond the magnetoresistive semiconductor device 110 in directions along the hard axis. As depicted, the bottom shield 140 may extend past semiconductor device 110 by a distance similar to the distance of one or both of top shields 150a and 150b, which extends past semiconductor device 110. When an external magnetic field is applied in a direction along the hard axis, the external magnetic field may more preferentially propagate through the bottom shield 140, as the bottom shield 140 is a single, continuous shield. Additionally, and/or alternatively, the external magnetic field may propagate through the top shield 150a and 150b. The top shields 150a and 150b and bottom shield 140 may be configured to limit or otherwise inhibit the external magnetic field from propagating from the top shields 150a and 150b to the bottom shield 140, or vice versa, thereby reducing the effects of a magnetic field in a direction of the perpendicular axis. Such a top shield and bottom shield arrangement may provide the magnetoresistive semiconductor device 110 with magnetic field immunity along directions of the easy, hard, and perpendicular axes of at least 100 Oe+/−15%.

FIG. 4B depicts a top shield and bottom shield arrangement, in which the bottom shield extends past the top shields in directions along the hard axis. The bottom shield 240 may extend beyond the magnetoresistive semiconductor device 110 and the top shields 150a and 150b in directions along the hard axis. For example, the bottom shield 240 may extend about 0 μm to about 210 μm+/−15% past the top shields 150a and 150b in directions along the hard axis. In one embodiment, bottom shield 240 may extend about 150 μm+/−15 past top shields 150a and 150b in directions along the hard axis. When an external magnetic field is applied in a direction along the hard axis, the external magnetic field may more preferentially propagate through the bottom shield 240, as the bottom shield 240 is a single shield that extends farther away from the semiconductor device 100 than top shields 150a and 150b. Additionally, and/or alternatively, the external magnetic field may propagate through the top shields 150a and 150b. The top shields 150a and 150b and bottom shield 240 may be configured to limit or otherwise inhibit the external magnetic field from propagating from the top shields 150a and 150b to the bottom shield 240, or vice versa, thereby reducing the effects of a magnetic field in a direction of the perpendicular axis. Such a top shield and bottom shield arrangement may provide the magnetoresistive semiconductor device 110 with magnetic field immunity along directions of the easy, hard, and perpendicular axes of 100 Oe+/−15%.

Due to the spacing between a top shield and a bottom shield and the magnetoresistive semiconductor device deposited between the top and bottom shields, a magnetic field may more easily propagate through either top shield or the bottom shield. As mentioned above, the top and bottom shields may be formed of a metal having a high permeability, and thus, may more easily propagate a magnetic field. The spacing between the top shield and bottom shield and the magnetoresistive semiconductor device may not easily propagate a magnetic field as the top and bottom shields.

When an external magnetic field is applied in a direction along the hard axis, the external magnetic field may more preferentially propagate through the bottom shield 240, as the bottom shield 240 is a single shield that extends past the top shields 150a and 150b. Additionally, and/or alternatively, the external magnetic field may propagate through the top shields 150a and 150b. The top shields 150a and 150b and bottom shield 240 may be configured to limit or otherwise inhibit the external magnetic field from propagating from the top shields 150a and 150b to the bottom shield 240, thereby reducing the effects of a magnetic field in a direction of the perpendicular axis. Such a top shield and bottom shield arrangement may provide the magnetoresistive semiconductor device 110 with magnetic field immunity along directions of the hard, easy, and perpendicular axes of at least 100 Oe+/−15%.

FIG. 4C depicts a top shield and bottom shield arrangement, in which there are two bottom shields that extend past the top shields in directions along the hard axis. The bottom shields 340a and 340b may extend beyond the magnetoresistive semiconductor device 110 and the top shields 150a and 150b in directions along the hard axis. For example, bottom shields 340a and 340b may extend about 150 μm past the top shields 150a and 150b in directions along the hard axis. The embodiment of FIG. 4C depicts a more symmetrical design for top shields 150a and 150b and bottom shields 340a and 340b in a gap and a length in directions along the hard axis. As shown in FIG. 4C, a gap or space may be between bottom shields 340a and 340b. The space between bottom shields 340a and 340b may be less than the space between top shields 150a and 150 in directions along the hard axis. In some embodiments, however, the space between bottom shields 340a and 340b may be greater than or the same as the space between the top shields 150a and 150b.

When an external magnetic field is applied in directions along the hard axis, the external magnetic field may propagate through bottom shields 340a and 340b with an equal amount as that through the top shields 150a and 150b, thereby reducing a coupling between the top shields 150a and 150b and bottom shields 340a and 340b, respectively, and reducing the effects of a magnetic field in a direction of the perpendicular axis. Alternatively, when an external magnetic field is applied in directions along the hard axis, the external magnetic field may more preferentially propagate through bottom shields 340a and 340b, as the bottom shields 340a and 340b extends past the top shields 150a and 150b and the space between bottom shields 340a and 340b is less than the space between top shields 150a and 150b in directions along the hard axis. Additionally, and/or alternatively, the external magnetic field may propagate through the top shields 150a and 150b. The top shields 150a and 150b and bottom shields 340a and 340b may be configured to reduce a coupling between the top shields 150a and 150b and bottom shields 340a and 340b, respectively, and reducing the effects of a magnetic field in a direction of the perpendicular axis. Such a top shield and bottom shield arrangement may provide the magnetoresistive semiconductor device 110 with magnetic field immunity along directions of easy, hard, and perpendicular axes of at least 100 Oe+/−15%.

Figure 5B:
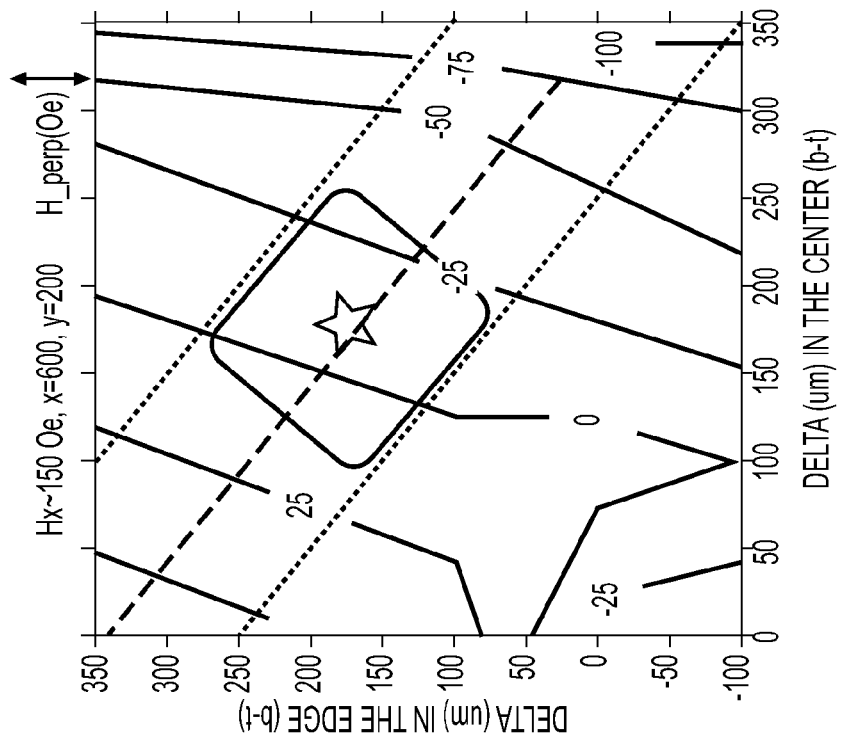
FIGS. 5A and 5B depict a two dimensional simulation in which shielding provides a magnetic field immunity along a direction of the perpendicular axis of greater than 100 Oe, according to embodiments of the present disclosure.
Figure 5A:
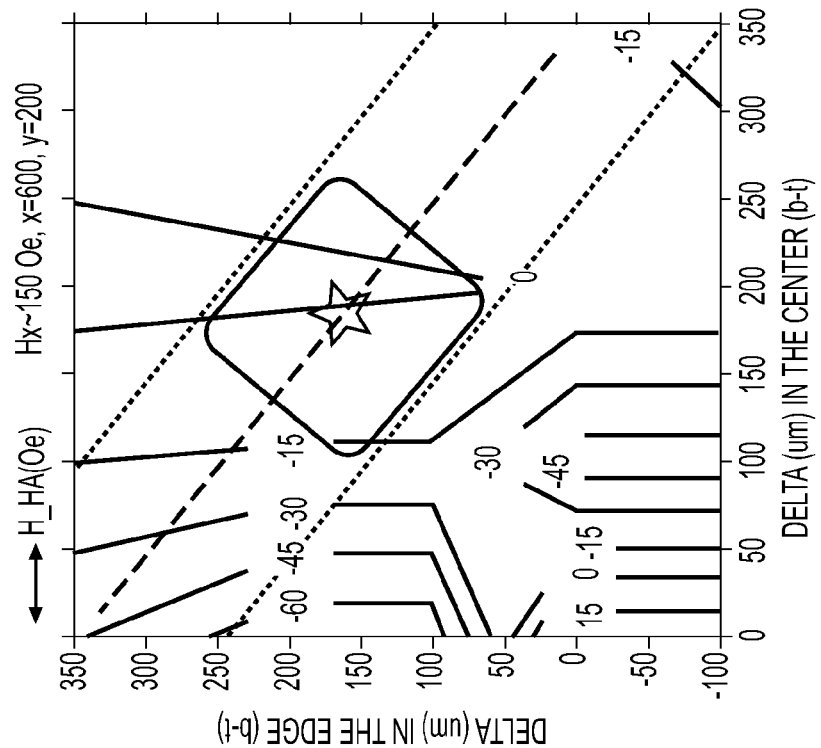
Figure 5C:
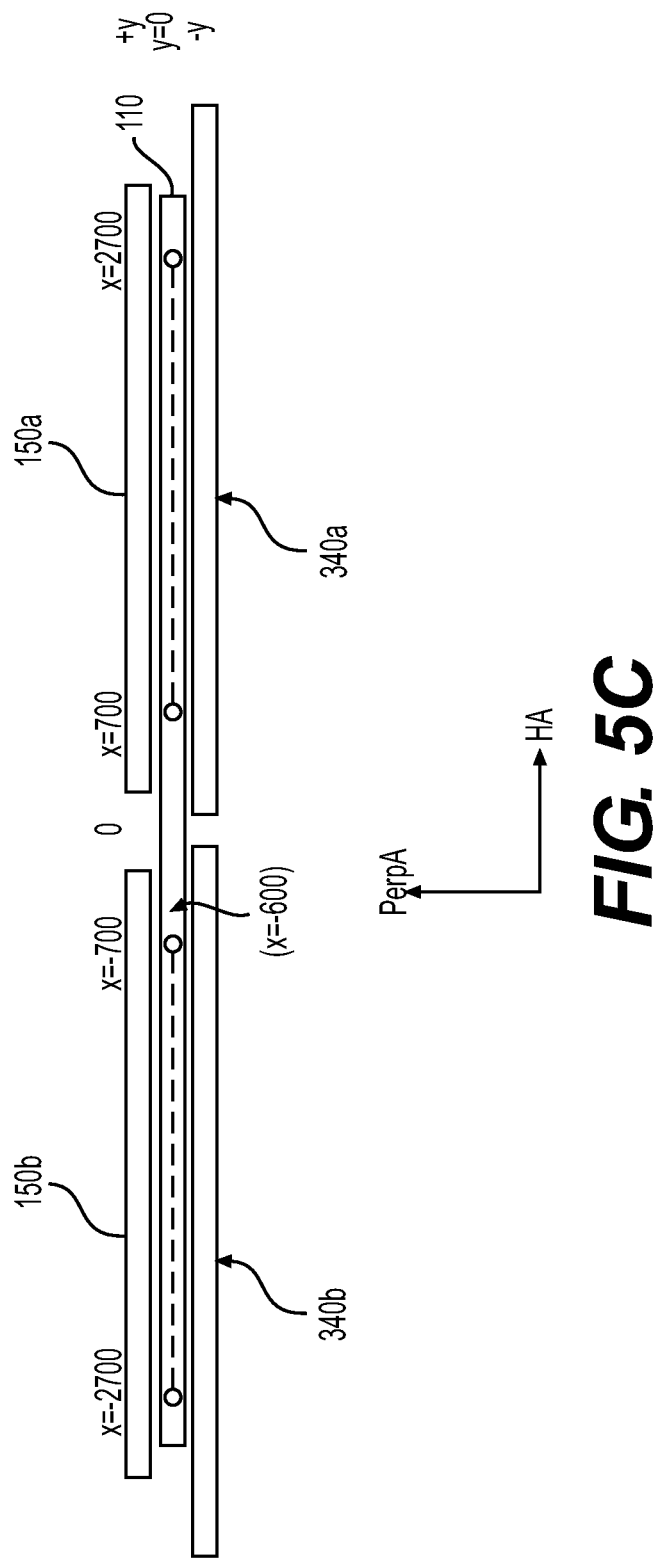
FIG. 5C depicts a cross section view of a top shield and bottom shield arrangement of the shielding in the two dimensional simulation of FIGS. 5A and 5B, according to embodiments of the present disclosure.

FIGS. 5A and 5B depict a two dimensional simulation in which shielding provides a magnetic field immunity along a direction of the perpendicular axis of greater than 100 Oe. The simulation accounts for a center opening (window) in the top shield, and the bottom shield extending beyond the top shield in a direction along the hard axis. In FIG. 5A, the contour lines represent a magnetic field H along a direction of the hard axis when an external magnetic field is applied along the hard axis of about 100 Oe. In FIG. 5B, the contour lines represent a magnetic field H along a direction of the perpendicular axis when an external magnetic field is applied along the hard axis of about 100 Oe FIG. 5C depicts a cross section view of a top shield and bottom shield arrangement of the shielding in the two dimensional simulation of FIGS. 5A and 5B. The two dimensional simulation is evaluated at a position in which x=−600 µm when a 100 Oe external magnetic field is applied in a direction of the hard axis, where x is a position within the WBGA package 100 in directions along the hard axis. In this embodiment, the magnetoresistive semiconductor device 110 is a magnetoresistive memory device, such as a MRAM chip having an array of magnetic tunnel junction ("MTJ") bits. The bits may be located at about x=−700 µm to about x=−2700 µm, and about x=700 µm to about x=2700 µm. The preferred design location may be around x=200 µm and y=150 µm, which is marked by a star in FIGS. 5A and 5B. Y may be a position within the WBGA package 100 in directions along the perpendicular axis. The rounded square box around the star in FIGS. 5A and 5B depict a 100 µm variation in shield size and alignment.

As shown in FIG. 5C, the bottom shields 340a and 340b may extend beyond the magnetoresistive semiconductor device 110 and the top shields 150a and 150b in a direction along the hard axis. For example, bottom shields 340a and 340b may extend about 150 µm past the top shields 150a and 150b in a direction along the hard axis. Additionally, the space between bottom shields 340a and 340b may be less than the space between top shields 150a and 150b in a direction along the hard axis.

Figure 6:
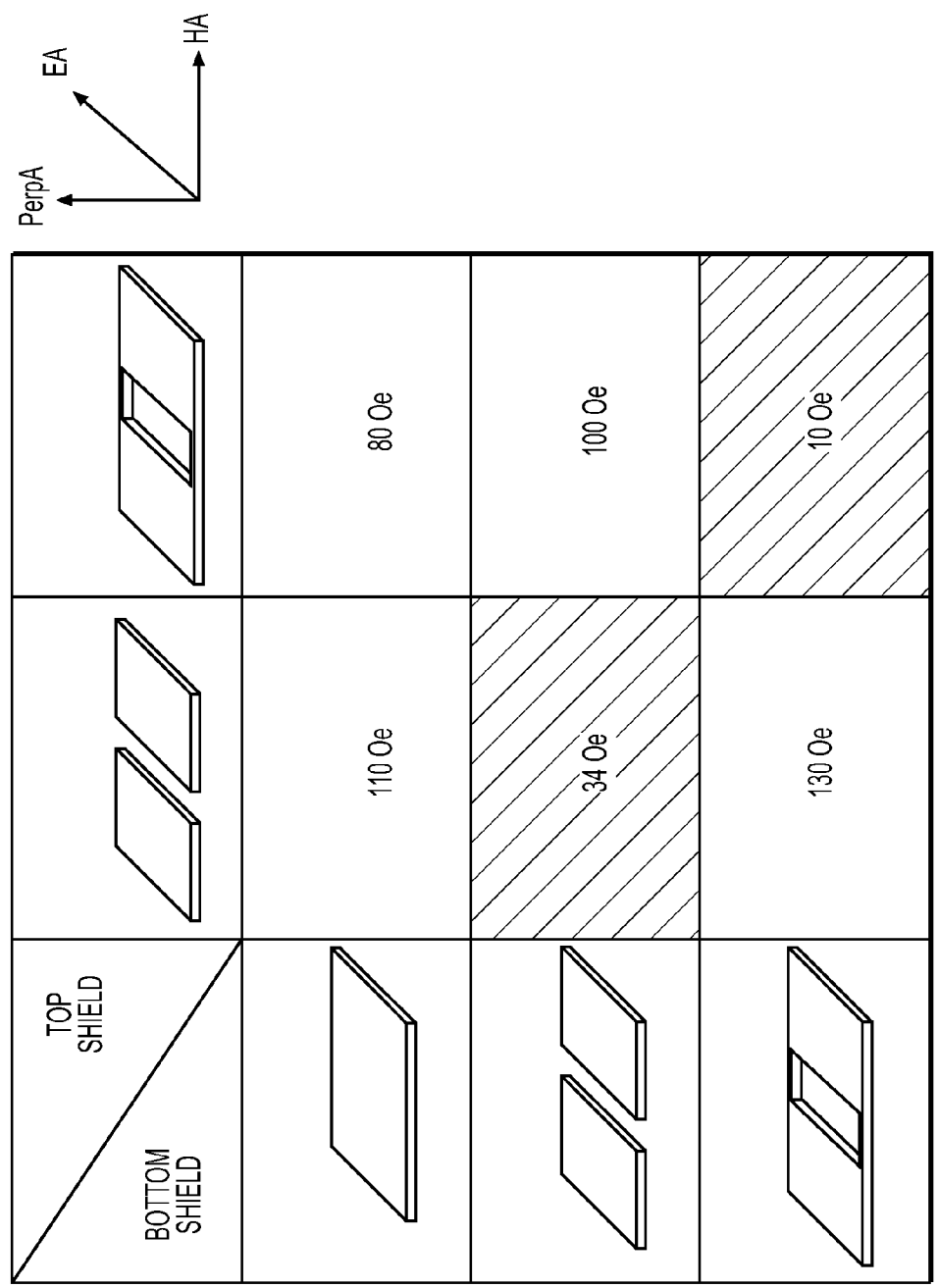
FIG. 6 depicts six top shield and bottom shield arrangements in which a 100 Oe external magnetic field is applied in the direction of the hard axis, according to embodiments of the present disclosure.

With reference now to FIG. 6, six top shield and bottom shield arrangements are depicted in which a 100 Oe external magnetic field is applied in the direction of the hard axis. The magnetic field strengths depicted in the table are maximal coupled magnetic field strengths measured in the direction of the perpendicular axis. As indicated by the cross-hatched cells, top shield and bottom shield arrangements that are symmetric had the least magnetic field strengths in the direction of the perpendicular axis.

As indicated by the shielding performance, the best performance occurred when the top shield and bottom shield are symmetrical, and the top shield and the bottom shield included a center opening rather than having two separate shields. The two bridging parts of the top shield and bottom shield may be about 500 µm wide in the direction along the easy axis.

Figure 7A:
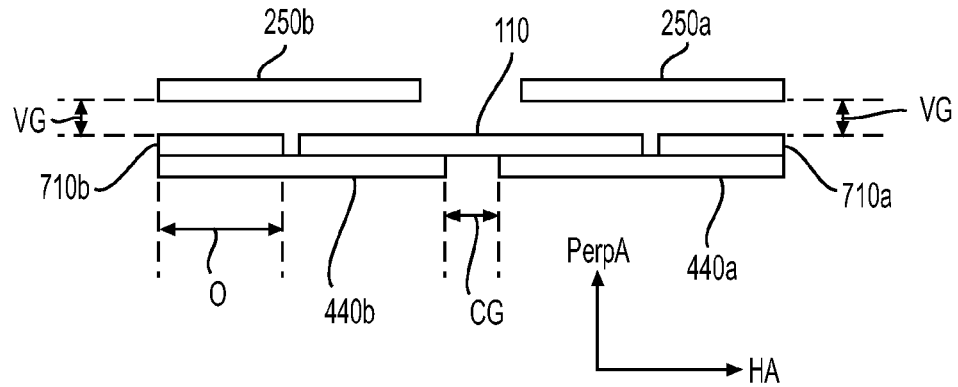
FIGS. 7A, 7B, and 7C depict cross section views of various shielding arrangements having a center shield, according to embodiments of the present disclosure.
Figure 7B:
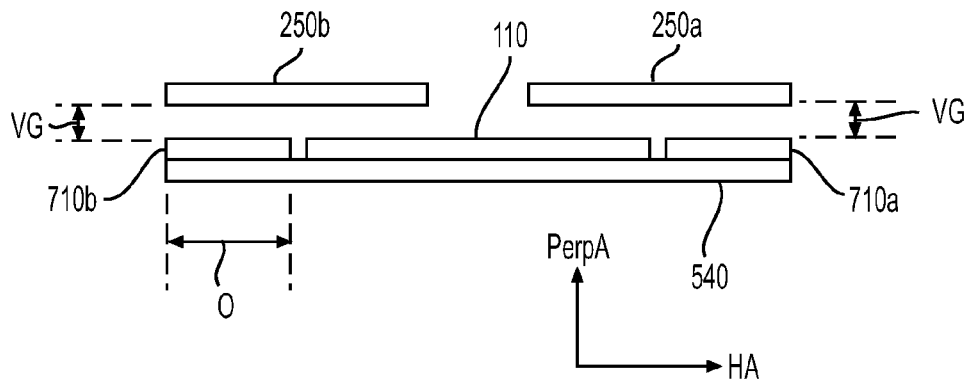
Figure 7C:
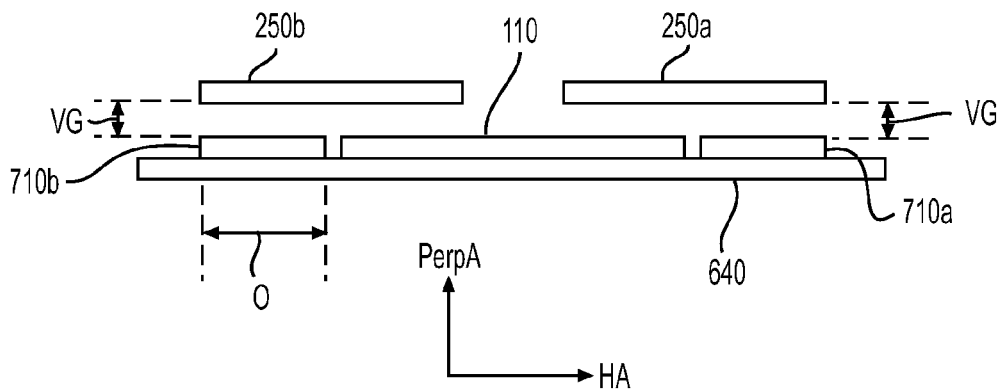

FIGS. 7A, 7B, and 7C depict cross section views of various shielding arrangements having a center shield, according to embodiments of the present disclosure. A center shield may be provided between the top and bottom shields and adjacent to the magnetoresistive semiconductor device. In one embodiment, a thickness of the center shield may be equal to the spacing between the top shield and the bottom shield magnetoresistive. When the magnetoresistive semiconductor device is a magnetoresistive memory device including an array of magnetic tunnel junction ("MTJ") bits, the bits may be located within the center shield in directions along the hard and easy axes. Though the use of a top, center, and bottom shield is described herein, those of ordinary skill in the art will understand that only a bottom shield, a center shield, or a top shield may be provided within the principles of the present disclosure. Further, those of ordinary skill in the art will understand that a combination of a bottom shield and a center shield, a top shield and a center shield, or a top shield and a bottom shield may be provided within the principles of the present disclosure.

As shown in FIG. 7A, the shield arrangement of the magnetoresistive semiconductor device 110 may include top shields 250a and 250b, center shields 710a and 710b, and bottom shields 440a and 440b. A space and/or vertical gap ("VG") may be between the top shield 250a and center shield 710a and between the top shield 250b and center shield 710b in a direction of the perpendicular axis. As will be discussed in detail below the vertical gap may be from about 0 µm to about 200 µm. In one embodiment of the present disclosure, the vertical gap may be about 10 µm+/−15%. In another embodiment of the present disclosure, the vertical gap may be less than about 30 µm+/−15%. A space and/or center gap ("CG") may be between the bottom shield 440a and bottom shield 440b in a direction of the hard axis. As will be discussed in detail below the center gap may be from about 0 µm to about 700 µm. In one embodiment of the present disclosure, the center gap may be about 400 µm+/−15%, or the center gap may be about 500 µm+/−15%. An overlay ("O") may exist where the center shield 710a overlaps the bottom shield 440a in a direction of the hard axis. As will be discussed in detail below the overlap may be from about 0 µm to about 800 µm. In one embodiment of the present disclosure, the overlap may be about 700 µm+/−15%.

When an external magnetic field is applied in a direction along the hard axis, the external magnetic field may more preferentially propagate through the bottom shields 440a and 440b. Additionally, and/or alternatively, the external magnetic field may propagate through the top shields 250a and 250b. The top shields 250a and 250b and bottom shields 440a and 440b may be configured to limit or otherwise inhibit the external magnetic field in the direction of the hard axis from propagating from the top shields 250a and 250b to the bottom shields 440a and 440b, thereby reducing the effects of a magnetic field in a direction of the perpendicular axis. Such a shield arrangement may provide the magnetoresistive semiconductor device 110 with magnetic field immunity along directions of the perpendicular axes of less than or equal to 100 Oe+/−15%.

When an external magnetic field is applied in a direction along the perpendicular axis, the external magnetic field may more preferentially propagate through the top shield 250a, center shield 710a, and bottom shield 440a and/or through the top shield 250b, center shield 710b, and bottom shield 440b. The shielding arrangement, as shown in FIG. 7A, may reduce the external magnetic field in the direction of the perpendicular axis from passing through the magnetoresistive semiconductor device 110. Such a shield arrangement may provide the magnetoresistive semiconductor device 110 with magnetic field immunity along directions of the perpendicular axes of less than or equal to about 100 Oe+/−15%.

As shown in FIG. 7B, the shield arrangement of the magnetoresistive semiconductor device 110 may include top shields 250a and 250b, center shields 710a and 710b, and a single bottom shield 540. A space and/or vertical gap ("VG") may be between the top shield 250a and center shield 710a and between the top shield 250b and center shield 710b in a direction of the perpendicular axis. As will be discussed in detail below, the vertical gap may be from about 0 µm to about 200 µm. In one embodiment of the present disclosure, the vertical gap may be about 10 µm+/−15%. In another embodiment of the present disclosure, the vertical gap may be less than about 30 µm+/−15%. An overlay ("O") may exist where the center shield 710a overlaps the bottom shield 400a in a direction of the hard axis. As will be discussed in detail below, the overlap may be from about 0

µm to about 800 µm. In one embodiment of the present disclosure, the overlap may be about 700 µm+/−15%.

When an external magnetic field is applied in a direction along the hard axis, the external magnetic field may more preferentially propagate through the bottom shield 540. Additionally, and/or alternatively, the external magnetic field may propagate through the top shield 250*a* and 250*b*. The top shields 250*a* and 250*b* and bottom shield 540 may be configured to limit or otherwise inhibit the external magnetic field in the direction of the hard axis from propagating from the top shields 250*a* and 250*b* to the bottom shield 540, thereby reducing the effects of a magnetic field in a direction of the perpendicular axis. Such a shield arrangement may provide the magnetoresistive semiconductor device 110 with magnetic field immunity along directions of the perpendicular axes of less than or equal to 100 Oe+/−15%.

When an external magnetic field is applied in a direction along the perpendicular axis, the external magnetic field may more preferentially propagate through the top shield 250*a*, center shield 710*a*, and bottom shield 540 and/or through the top shield 250*b*, center shield 710*b*, and bottom shield 540. The shielding arrangement shown in FIG. 7B may limit or otherwise inhibit the external magnetic field in the direction of the perpendicular axis from passing through the magnetoresistive semiconductor device 110. Such a shield arrangement may provide the magnetoresistive semiconductor device 110 with magnetic field immunity along directions of the perpendicular axes of less than or equal to 100 Oe+/−15%.

With reference to FIG. 7C, the shield arrangement of the magnetoresistive semiconductor device 110 may include top shields 250*a* and 250*b*, center shields 710*a* and 710*b*, and a single bottom shield 640. A space and/or vertical gap ("VG") may be between the top shield 250*a* and center shield 710*a* and between the top shield 250*b* and center shield 710*b* in a direction of the perpendicular axis. As will be discussed in detail below the vertical gap may be from about 0 µm to about 200 µm. In one embodiment of the present disclosure, the vertical gap may be about 10 µm+/−15%. In another embodiment of the present disclosure, the vertical gap may be less than about 30 µm+/−15%. An overlay ("O") may exist where the center shield 710*a* overlaps the bottom shield 400*a* in a direction of the hard axis. As will be discussed in detail below the overlap may be from about 0 µm to µm 800 µm. In one embodiment of the present disclosure, the overlap may be about 700 µm+/−15%.

When an external magnetic field is applied in a direction along the hard axis, the external magnetic field may more preferentially propagate through the bottom shield 640, as the bottom shield extends beyond the top shields 250*a* and 250*b* in directions of the hard axis. Additionally, and/or alternatively, the external magnetic field may propagate through the top shield 250*a* and 250*b*. The top shields 250*a* and 250*b* and bottom shield 540 may be configured to limit or otherwise inhibit the external magnetic field in the direction of the hard axis from propagating from the top shields 250*a* and 250*b* to the bottom shield 640, thereby reducing the effects of a magnetic field in a direction of the perpendicular axis. Such a shield arrangement may provide the magnetoresistive semiconductor device 110 with magnetic field immunity along directions of the perpendicular axes of less than or equal to 100 Oe+/−15%.

When an external magnetic field is applied in a direction along the perpendicular axis, the external magnetic field may more preferentially propagate through the top shield 250*a*, center shield 710*a*, and bottom shield 640 and/or through the top shield 250*b*, center shield 710*b*, and bottom shield 640. The shielding arrangement, as shown in FIG. 7C, may reduce the external magnetic field in the direction of the perpendicular axis from passing through the magnetoresistive semiconductor device 110. Such a shield arrangement may provide the magnetoresistive semiconductor device 110 with magnetic field immunity along directions of the perpendicular axes of less than or equal to 100 Oe+/−15%.

Figure 8C:
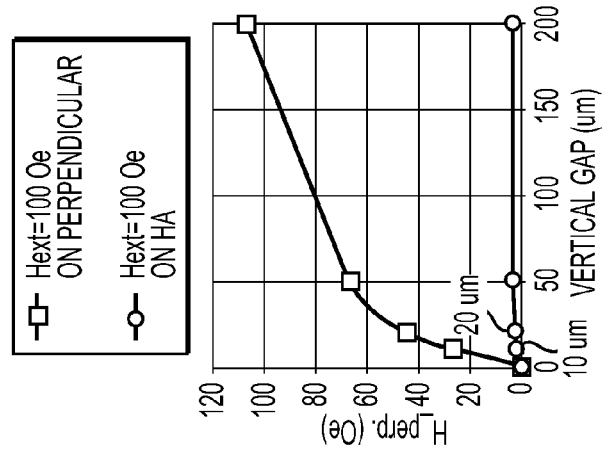
FIGS. 8A, 8B, and 8C depict graphs of a perpendicular magnetic field on magnetoresistive semiconductor devices using various shielding arrangements, according to embodiments of the present disclosure.
Figure 8B:
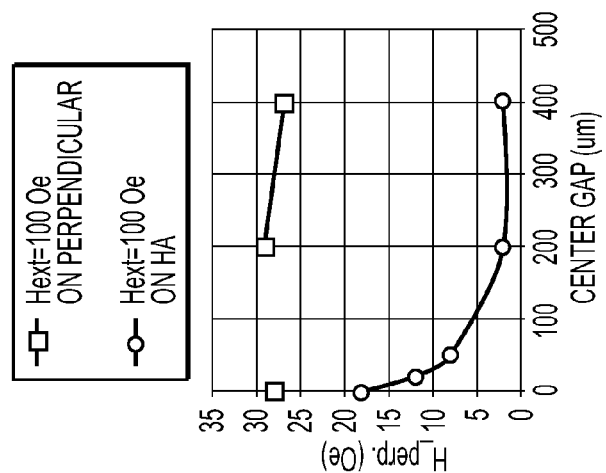
Figure 8A:
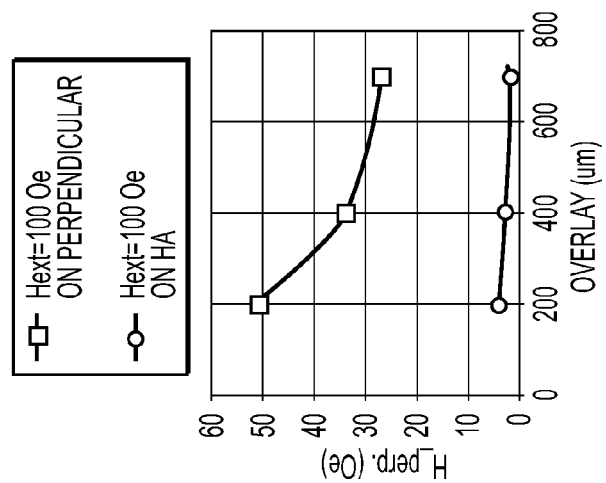

FIGS. 8A, 8B, and 8C depict graphs of a perpendicular magnetic field on magnetoresistive semiconductor devices using various shielding arrangements. FIG. 8A depicts a perpendicular magnetic field on magnetoresistive semiconductor devices with various overlay lengths of the center shields and the bottom shields, as shown in FIGS. 7A, 7B, and 7C. As shown in the graph, when an external magnetic field of about 100 Oe is applied in the direction of the hard axis, the perpendicular magnetic field on a magnetoresistive semiconductor device ranges from about 5 Oe to about 1 Oe as the overlay increases from about 200 µm to about 700 µm. When an external magnetic field of about 100 Oe is applied in the direction of the perpendicular axis, the perpendicular magnetic field on a magnetoresistive semiconductor device decreases from about 50 Oe to about 28 Oe as the overlay increases from about 200 µm to about 700 µm.

FIG. 8B depicts a magnetic field in a direction along the perpendicular axis with various potential center gap distances between the bottom shields shown in FIG. 7A. As shown in the graph, when an external magnetic field of about 100 Oe is applied in the direction of the hard axis, the perpendicular magnetic field on a magnetoresistive semiconductor device decreases from about 18 Oe to about 2 Oe as the center gap increases from about 0 µm to about 400 µm. When an external magnetic field of about 100 Oe is applied in the direction of the perpendicular axis, the perpendicular magnetic on a magnetoresistive semiconductor device ranges from about 28 Oe to about 26 Oe as the center gap increases from about 0 µm to about 400 µm.

FIG. 8C depicts a magnetic field in a direction along the perpendicular axis with various vertical gap distances between the top shields and center shields, as shown in FIGS. 7A, 7B, and 7C. As shown in the graph, when an external magnetic field of about 100 Oe is applied in the direction of the hard axis, the perpendicular magnetic on a magnetoresistive semiconductor device ranges from about 0 Oe to about 5 Oe as the vertical gap increases from about 0 µm to about 200 µm. When an external magnetic field of about 100 Oe is applied in the direction of the perpendicular axis, the perpendicular magnetic on a magnetoresistive semiconductor device increases from about 0 Oe to about 110 Oe as the vertical gap increases from about 0 µm to about 200 µm.

In the shield arrangements, as shown in FIGS. 7A, 7B, and 7C, a magnetic field along perpendicular direction may be less than or equal to about 100 Oe depending on the shield arrangement. By including center shields between the top and bottom shields, as described above, the center gap, vertical gap, and overlay may be adjusted. Additionally, and/or alternatively, a thickness of the center shields may be adjusted to increase and/or decrease the magnetic field on a magnetoresistive semiconductor device along perpendicular direction when an external magnetic field is applied in a direction along the perpendicular axis. The thicknesses of the center shields may vary from about 50 µm to about 500 µm. In one particular embodiment of the present disclosure, the thickness of the center shield may be about 150 µm+/−15%.

Figure 9:
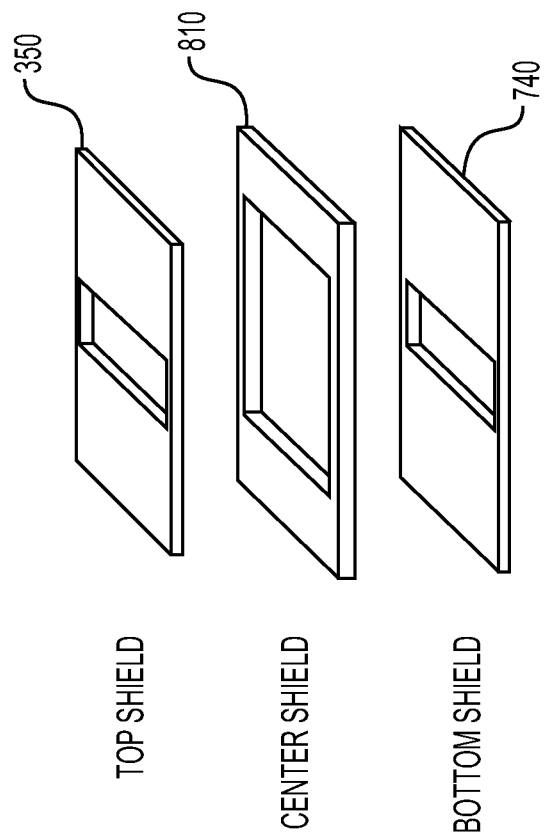
FIG. 9 depicts a perspective view of another shielding arrangement having a center shield, according to an embodiment of the present disclosure.
Figure 9:
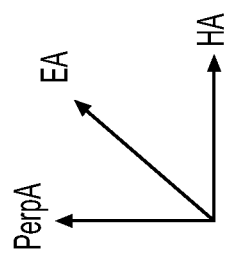

FIG. 9 depicts perspective view of another shielding arrangement having a center shield, according to embodiments of the present disclosure. As shown in FIG. 9, the shield arraingment of the magnetoresistive semiconductor device 110 may include top shield 350, center shield 810, and bottom shield 740. A space and/or vertical gap may be between the top shield 350 and center shield 810 in a direction of the perpendicular axis, a center opening may exist in the center shield, and an overlay may exist where the center shield 810 overlaps the bottom shield 740 in a direction of the hard axis. In one embodiment, the top shield and bottom shield are symmetrical, and the top shield, the center shield, and the bottom shield included a center opening rather than having two separate shields. The bridging parts of the top shield, center shield, and bottom shield may be about 500 µm wide in the direction along the easy axis.

Figure 10A:
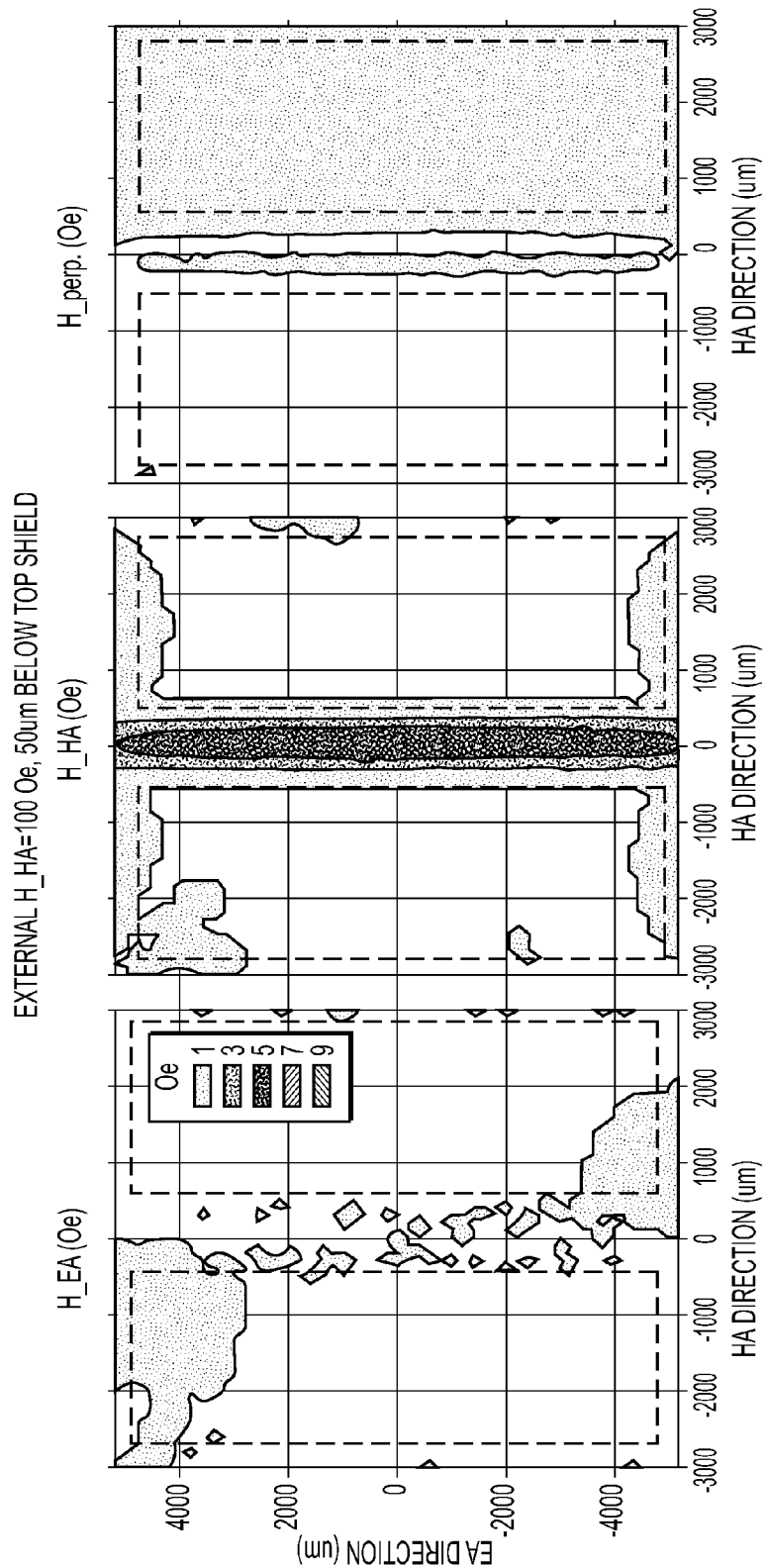
FIGS. 10A and 10B depict a top down view of a simulation of the shielding arrangement shown in FIG. 9, according to an embodiment of the present disclosure.
Figure 10B:
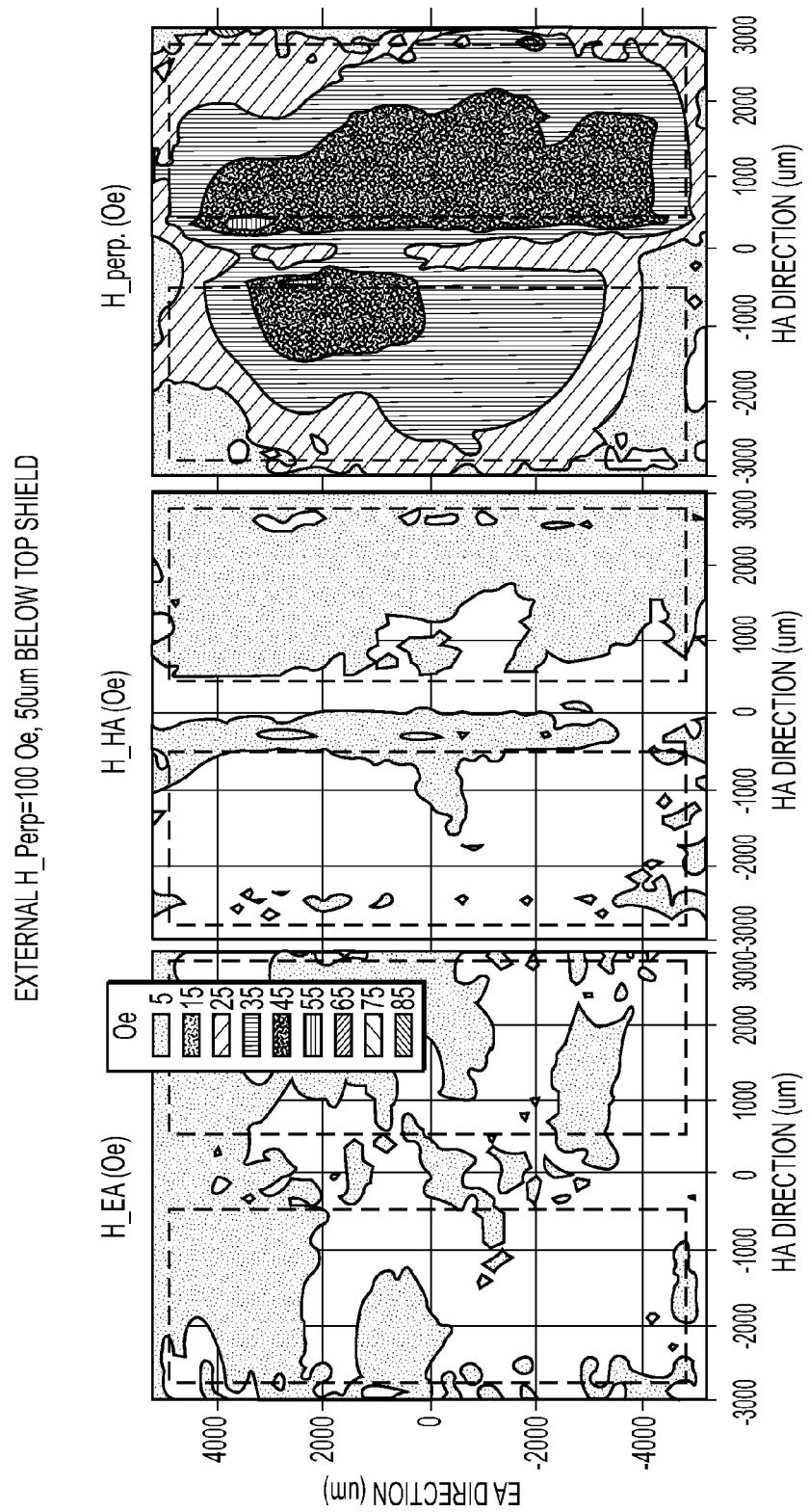

FIGS. 10A and 10B depict a top down view of a simulation of the shielding arrangement shown in FIG. 9, according to an embodiment of the present disclosure. The response of a WBGA package 100 including the shielding arrangement shown in FIG. 9 has been separated into a response measured along directions of the easy axis (left graph), a response measured along directions of the hard axis (middle graph), and a response measured along directions of the perpendicular axis (right graph) in FIGS. 10A and 10B. The areas within the dashed lines shown in FIGS. 10A and 10B depict areas of an active array of magnetic tunnel junction ("MTJ") bits when the magnetoresistive semiconductor device 110 is a magnetoresistive memory device.

FIG. 10A depicts a magnetic field response in which an external magnetic field is applied along a direction of the hard axis of about 100 Oe. The magnetic field responses are depicted by the various cross-hatchings. The left simulation depicts a magnetic field response in a direction of the easy axis, the center simulation depicts a magnetic field response in a direction of the hard axis, and the right simulation depicts a magnetic field response in a direction of the perpendicular axis.

FIG. 10B depicts a magnetic field response in which an external magnetic field is applied along a direction of the perpendicular axis of about 100 Oe. The magnetic field responses are depicted by the various cross-hatchings. The left simulation depicts a magnetic field response in a direction of the easy axis, the center simulation depicts a magnetic field response in a direction of the hard axis, and the right simulation depicts a magnetic field response in a direction of the perpendicular axis. As indicated by the right simulation of FIG. 10 B, there may be a magnetic field response in a direction of the perpendicular axis of about 55 Oe when there is a vertical gap between the top shield and center shield shown in FIG. 9 of about 10 µm. The 55 Oe magnetic field response in the direction of the perpendicular axis may be reduced when the vertical gap between the top shield and center shield shown in FIG. 9 is reduced to less than 10 µm.

Figure 11:
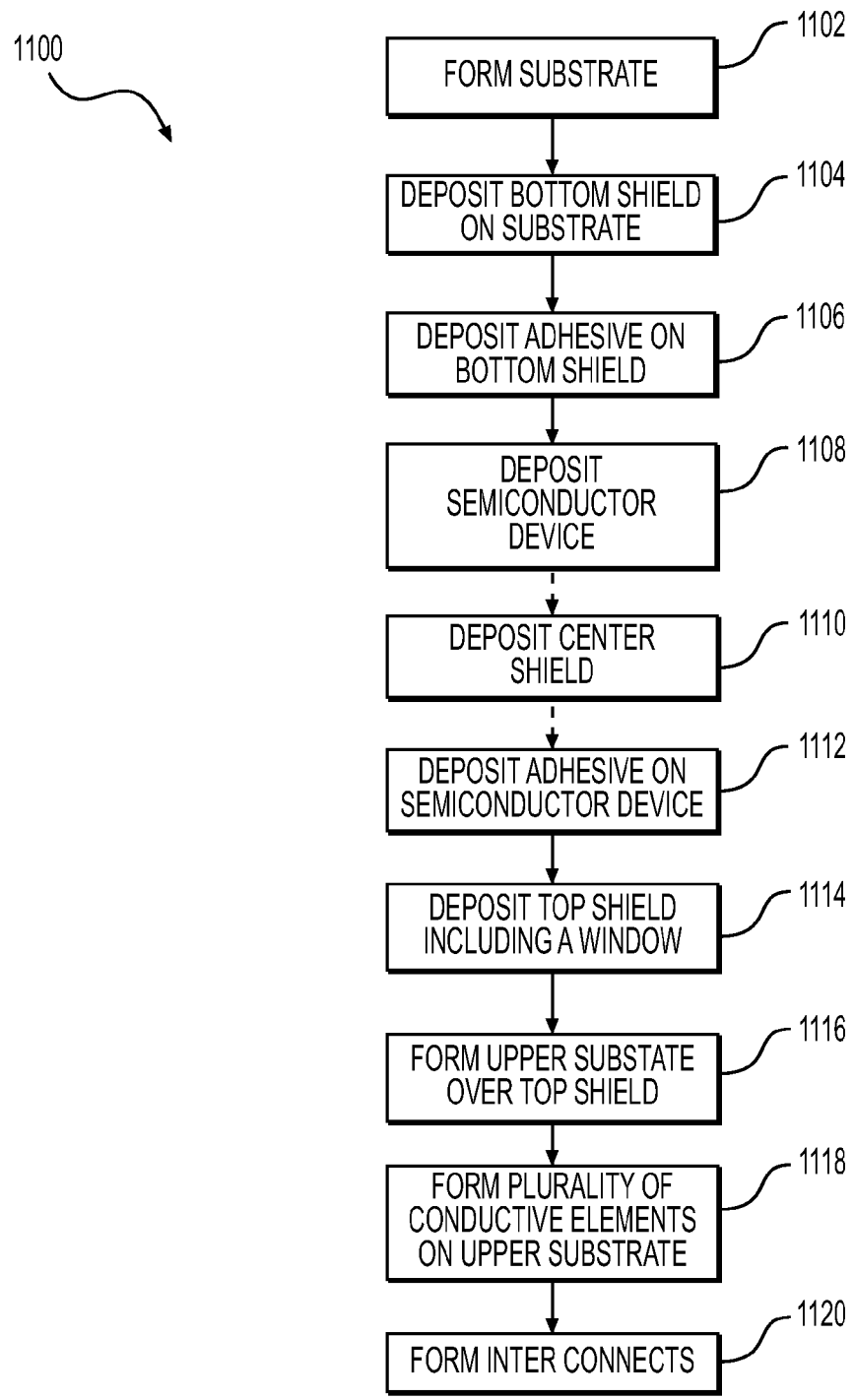
FIG. 11 shows a flowchart of a fabrication process for producing the magnetoresistive memory device.

FIG. 11 depicts a flowchart 1100 of a fabrication method for packaging magnetoresistive semiconductor devices. Flowchart 1100 may begin at step 1102 in which a substrate, such as substrate 160, may be formed. Then, at step 1104, a bottom shield, such as bottom shield 160, may be deposited on the substrate. At step 1106, an adhesive, such as adhesive 145, may be deposited on the bottom shield. Following deposition of the adhesive, at step 1108, a magnetoresistive semiconductor device, such as magnetoresistive semiconductor device 110, may be deposited on the bottom shield, and/or bonded to the bottom shield by the adhesive. Optionally, at step 1110, a center shield, such a center shield 810 having a window or center shields 710a and 710b, may be deposited on the bottom shield and/or adjacent to sides of the semiconductor device.

At step 1112, an adhesive, such as adhesive 155, may be deposited on the semiconductor device. Then, at step 1114, a top shield including a window, such as top shield 150, may be deposited on the adhesive. Instead of a single top shield with a window, a plurality of top shields may be deposited. An upper substrate, such as substrate 170, may then be formed on the top shield at step 1116, the upper substrate may include a window to allow connections to the semiconductor device.

At step 1118, a plurality of conductive elements may be formed on the upper substrate. Then, at step 1120, a plurality of interconnects may be formed to connect a plurality of contacts of the magnetoresistive semiconductor device through the window to the plurality of conductive elements formed on the substrate. Of course, other fabrication processes may subsequently occur, such as encasing in a molding compound.

Although various embodiments of the present disclosure have been illustrated and described in detail, it will be readily apparent to those skilled in the art that various modifications may be made without departing from the present disclosure or from the scope of the appended claims.

We claim:

1. A semiconductor package comprising:
a bottom shield extending in a first plane, the bottom shield including a first side, a second side, a first length extending between the first and second sides of the bottom shield and in the first plane, and a bottom window having a bottom window length extending in the first plane;
a magnetoresistive element having a first surface and a second surface opposing the first surface, the first surface of the magnetoresistive element deposited on at least a portion of the first length of the bottom shield at a first interface, wherein the first interface is parallel to the first plane; and
a top shield deposited on the second surface of the magnetoresistive element, the top shield having a top window for accessing the magnetoresistive element, wherein the top shield extends in a second plane parallel to the first plane, the top shield including a first side, a second side, and a second length extending between the first and second sides of the top shield and entirely in the second plane,
wherein the first length of the bottom shield is greater than the second length of the top shield,
wherein the top shield includes a first top shield and a second top shield, wherein the first top shield and the second top shield are both disposed in the second plane and deposited on the second surface of the magnetoresistive element to form the top window, and wherein the top window extends across an entire width of the top shield and includes a top window length extending in the second plane, and wherein the top window length is greater than the bottom window length.

2. The semiconductor package of claim 1, wherein the magnetoresistive element includes a magnetoresistive memory element including an array of magnetic tunnel junction bits.

3. The semiconductor package of claim 1, further comprising:

a plurality of interconnects that connect the magnetoresistive element to a plurality of conductive elements.

4. The semiconductor package of claim 1, further comprising:
a first adhesive deposited between the bottom shield and the magnetoresistive element; and
a second adhesive deposited between the top shield and the magnetoresistive element.

5. The semiconductor package of claim 1, further comprising:
a center shield deposited between the top shield and the bottom shield and adjacent to the magnetoresistive element.

6. The semiconductor package of claim 1, wherein the bottom shield includes a first bottom shield and a second bottom shield, the first bottom shield is deposited adjacent to the second bottom shield, and wherein the first side of the bottom shield is associated with the first bottom shield and the second side of the bottom shield is associated with the second bottom shield.

7. The semiconductor package of claim 6, wherein the first side of the first bottom shield is disposed at least 150 µm past the first side of the top shield in a direction of the first plane, and wherein the second side of the second bottom shield is disposed at least 150 µm past the second side of the top shield in a direction of the first plane.

8. The semiconductor package of claim 1, wherein the bottom shield includes a first bottom shield and a second bottom shield, the first bottom shield is deposited adjacent to the second bottom shield, and
wherein a center gap between the first bottom shield and the second bottom shield is less than or equal to 700 µm.

9. The semiconductor package of claim 1, wherein a thickness of at least one of the bottom shield and the top shield ranges from 50 µm to 500 µm.

10. The semiconductor package of claim 1, wherein at least one of the bottom shield and the top shield is formed of a metal having a high permeability.

11. The semiconductor package of claim 1, wherein at least one of the bottom shield and the top shield is formed of a material including one or more of nickel and iron.

12. The semiconductor package of claim 1, wherein at least one of the bottom shield and the top shield is formed of a soft magnetic material.

13. The semiconductor package of claim 1, wherein an entirety of the bottom shield extends in the first plane, an entirety of the top shield extends in the second plane, and wherein the entirety of the bottom shield is spaced away from the entirety of the top shield by a constant distance.

14. The semiconductor package of claim 1, wherein the bottom shield includes a bottom shield thickness extending perpendicular to the first plane, the top shield includes a top shield thickness extending perpendicular to the second plane, and the bottom shield thickness is equal to the top shield thickness.

15. The semiconductor package of claim 1, wherein the bottom shield and the top shield are within the semiconductor package, and wherein the semiconductor package includes only one magnetoresistive element in between the bottom shield and the top shield.

16. A semiconductor package comprising:
a bottom shield extending in a first plane, the bottom shield including a first side, a second side, and a first length extending between the first and second sides of the bottom shield in the first plane, wherein the bottom shield includes a bottom window that includes a bottom window length extending in the first plane;
a magnetoresistive element having a first surface and a second surface opposing the first surface, the first surface of the magnetoresistive element deposited on at least a portion of the first length of the bottom shield at a first interface, wherein the first interface is parallel to the first plane; and
a top shield including a first top shield and a second top shield each deposited on the second surface of the magnetoresistive element, the top shield having a top window for accessing the magnetoresistive element, wherein the top shield, including the first top shield and the second top shield, extends in a second plane parallel to the first plane, the top shield including a first side, a second side, and a second length extending between the first and second sides of the top shield and in the second plane, and wherein the top window includes a top window length extending in the second plane,
wherein the first length of the bottom shield is greater than the second length of the top shield, wherein the top window (i) is equidistantly positioned between the first side of the top shield and the second side of the top shield and (ii) extends across an entire width of the top shield, wherein the entire width of the top shield lies in the second plane, and wherein the top window length is greater than the bottom window length.

17. The semiconductor package of claim 16, wherein the magnetoresistive element includes a magnetoresistive memory element including an array of magnetic tunnel junction bits, and
wherein the semiconductor package further includes a plurality of interconnects that connect the magnetoresistive element to a plurality of conductive elements.

18. The semiconductor package of claim 16, wherein the bottom shield includes a first bottom shield and a second bottom shield, the first bottom shield is deposited adjacent to the second bottom shield, and
wherein the first side of the bottom shield is associated with the first bottom shield and the second side of the bottom shield is associated with the second bottom shield.

19. The semiconductor package of claim 16, wherein the bottom shield includes a first bottom shield and a second bottom shield, the first bottom shield is deposited adjacent to the second bottom shield, and
wherein a center gap between the first bottom shield and the second bottom shield is less than or equal to 700 µm.

20. A semiconductor package comprising:
a bottom shield extending in a first plane, the bottom shield including a first side, a second side, a first length extending between the first and second sides of the bottom shield and in the first plane, and a bottom window having a bottom window length extending in the first plane;
a magnetoresistive element having a first surface and a second surface opposing the first surface, the first surface of the magnetoresistive element deposited on at least a portion of the first length of the bottom shield at a first interface, wherein the first interface is parallel to the first plane; and
a top shield deposited on the second surface of the magnetoresistive element, the top shield having a top window for accessing the magnetoresistive element, wherein the top shield extends in a second plane parallel to the first plane, the top shield including a first side, a second side, and a second length extending between the first and second sides of the top shield and entirely in the second plane, wherein the first length of the bottom shield is greater than the second length of the top shield, wherein the bottom shield includes a first bottom shield and a second bottom shield, wherein the first bottom shield and the second bottom shield are both deposited in the first plane to form the bottom window, and wherein the bottom window extends across an entire width of the bottom shield and includes a bottom window length, wherein the top shield includes a first top shield and a second top shield, wherein the first top shield and the second top shield are both disposed in the second plane and deposited on the second surface of the magnetoresistive element to form the top window, and wherein the top window extends across an entire width of the top shield and includes a top window length that is greater than the bottom window length, wherein the first bottom shield is deposited adjacent to the second bottom shield, wherein the first side of the bottom shield is associated with the first bottom shield and the second side of the bottom shield is associated with the second bottom shield, and wherein the first side of the first bottom shield is disposed at least 150 µm past the first side of the top shield in a direction of the first plane, and wherein the second side of the second bottom shield is disposed at least 150 µm past the second side of the top shield in a direction of the first plane.

* * * * *